(12) United States Patent
Alshareef et al.

(10) Patent No.: US 7,807,522 B2
(45) Date of Patent: Oct. 5, 2010

(54) LANTHANIDE SERIES METAL IMPLANT TO CONTROL WORK FUNCTION OF METAL GATE ELECTRODES

(75) Inventors: Husam Alshareef, Austin, TX (US); Manfred Ramin, Austin, TX (US); Michael F. Pas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 532 days.

(21) Appl. No.: 11/700,278

(22) Filed: Jan. 31, 2007

(65) Prior Publication Data

US 2008/0160736 A1    Jul. 3, 2008

Related U.S. Application Data

(60) Provisional application No. 60/877,465, filed on Dec. 28, 2006.

(51) Int. Cl.
*H01L 21/338* (2006.01)
(52) U.S. Cl. ............... 438/176; 438/659; 257/E21.637

(58) Field of Classification Search ................ 438/176, 438/195, 659; 257/E21.637
See application file for complete search history.

(56) References Cited

U.S. PATENT DOCUMENTS

| 4,494,996 | A | 1/1985 | Ohno et al. |
| 2006/0134870 | A1* | 6/2006 | Luan et al. ............ 438/287 |
| 2006/0183277 | A1 | 8/2006 | Brask et al. |
| 2006/0286802 | A1 | 12/2006 | Yu et al. |

* cited by examiner

*Primary Examiner*—Asok K Sarkar
*Assistant Examiner*—Julia Slutsker
(74) *Attorney, Agent, or Firm*—Warren L. Franz; Wade J. Brady, III; Frederick J. Telecky, Jr.

(57) ABSTRACT

Semiconductor devices and fabrication methods are provided, in which metal transistor gates are provided for MOS transistors. Metal nitride is formed above a gate dielectric. A lanthaide series metal is implanted into the metal screen layer above the gate dielectric. The lanthaide metal is contained in the screen layer or at the interface between the screen metal layer and the gate dielectric. This process provides adjustment of the gate electrode work function, thereby tuning the threshold voltage of the resulting PMOS or NMOS transistors.

12 Claims, 10 Drawing Sheets

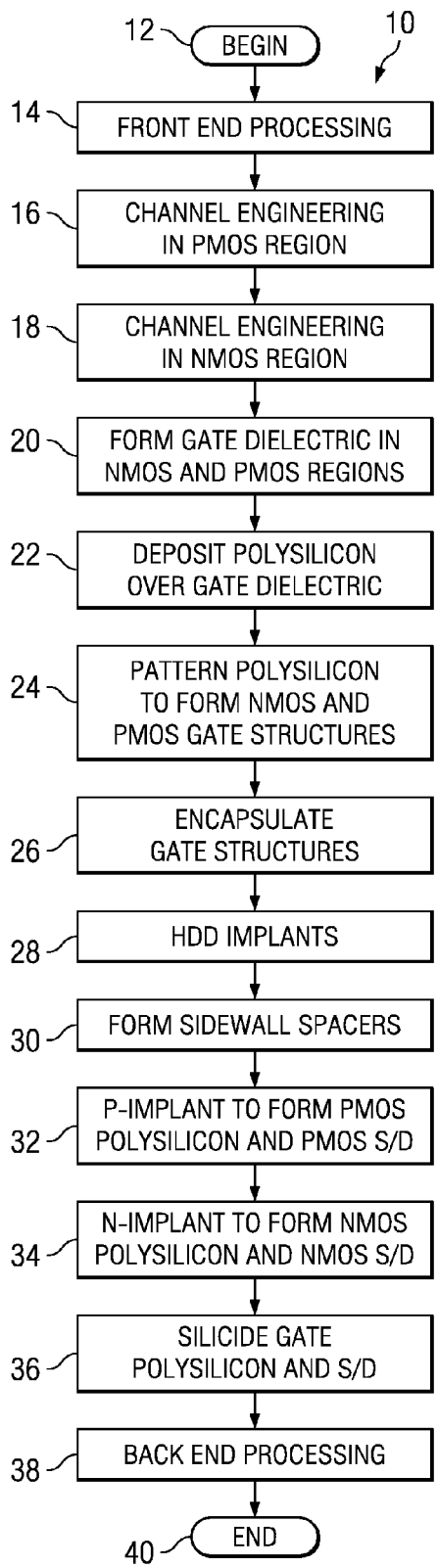
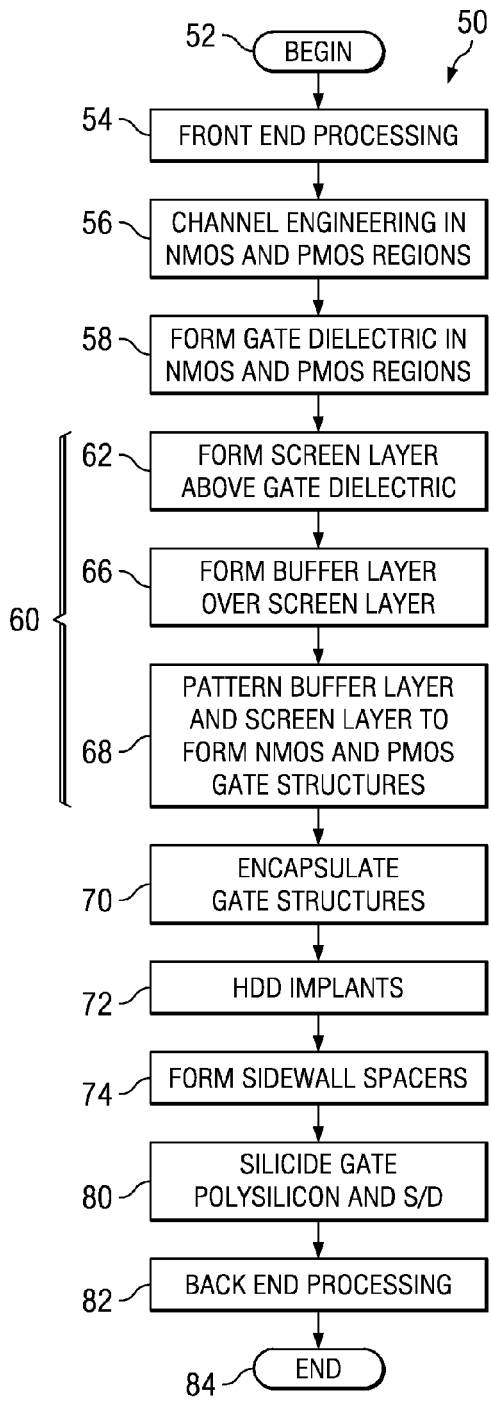
FIG. 1 (PRIOR ART)
FIG. 2

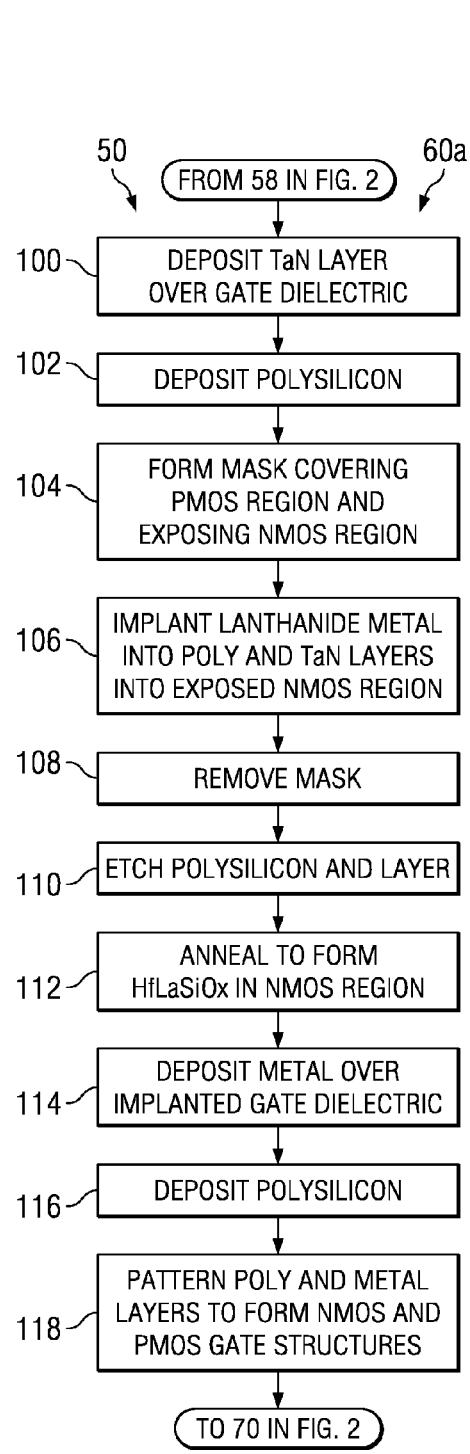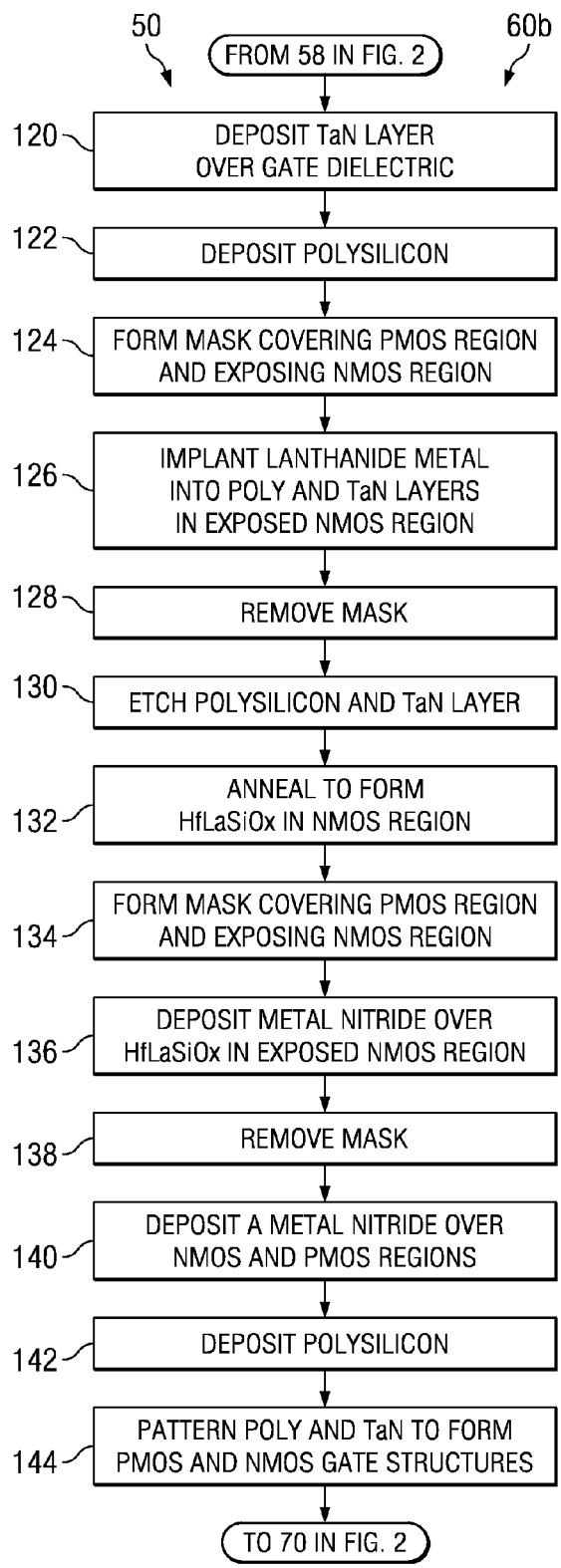
*FIG. 3A*
*FIG. 3B*

_US 7,807,522 B2_

LANTHANIDE SERIES METAL IMPLANT TO CONTROL WORK FUNCTION OF METAL GATE ELECTRODES

REFERENCE TO RELATED APPLICATIONS

This application claims priority to Ser. No. 60/877,465 filed Dec. 28, 2006, which is entitled "Lanthaide Series Metal Implant to Control Work Function of Metal Gate Electrodes."

FIELD OF INVENTION

The present invention relates generally to semiconductor devices and more particularly to metal gate MOS transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complimentary MOS (CMOS) devices have become widely used in the semiconductor industry, wherein both n-channel and p-channel (NMOS and PMOS) transistors are used to fabricate logic and other circuitry. For enhancement-mode (e.g., normally off) devices the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages (Vt) for the NMOS and PMOS transistors. To establish Vt values, the work functions of the PMOS and NMOS gate contact and the corresponding channel materials are independently tuned or adjusted through gate and channel engineering, respectively.

Gate stack engineering is employed to adjust the work function of the gate contact materials, where different gate work function values are set for PMOS and NMOS gates. The need to independently adjust PMOS and NMOS gate work functions has made polysilicon attractive for use as a gate contact material in CMOS processes, since the work function of polysilicon can be easily raised or lowered by doping the polysilicon with p-type or n-type impurities, respectively. The PMOS polysilicon gates are typically doped with p-type impurities and NMOS gate polysilicon is doped with n-type dopants, typically during implantation of the respective source/drain regions following gate patterning. In this way, the final gate work functions are typically near the Si conduction band edge for NMOS and near the valence band edge for PMOS. The provision of dopants into the polysilicon also has the benefit of increasing the conductivity of the gate electrode. Polysilicon has thus far been widely used in the fabrication of CMOS devices, wherein the gate engineering provides a desired gate electrode conductivity (e.g., sheet resistance value) by conventional tuning (e.g., implants), and the threshold voltage fine tuning is achieved by tailoring the channel doping level through the Vt adjust implants.

FIG. 1 illustrates a conventional CMOS fabrication process 10 beginning at 12, in which front end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying polysilicon layer are formed at 20 and 22, respectively, and the polysilicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures.

At 32, the PMOS source/drain regions and the PMOS polysilicon gate structures are implanted with p-type dopants to further define the PMOS source/drains, and to render the PMOS gates conductive. Similarly, the NMOS source/drain regions and the NMOS polysilicon gate structures are implanted at 34 with n-type dopants, further defining the NMOS source/drains and rendering the NMOS gates conductive. Thereafter, the source/drains and gates are silicided at 36 and back end processing (e.g., interconnect metalization, etc.) is performed at 38, before the process 10 ends at 40. In the conventional process 10, the channel engineering implants at 16 and 18 shift the Vt of the PMOS and NMOS channel regions, respectively, to compensate for the changes in the PMOS and NMOS polysilicon gate work functions resulting from the source/drain implants at 32 and 34, respectively. In this manner, the desired work function difference between the gates and channels may be achieved for the resulting PMOS and NMOS transistors, and hence the desired threshold voltages.

The gate dielectric or gate oxide between the channel and the gate electrode is an insulator material, typically $SiO_2$ or other dielectric, that operates to prevent current from flowing from the gate electrode into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin SiO$_2$ gate dielectric layers to prevent dopant diffusion from the gate polysilicon into the underlying channel. Accordingly, recent scaling efforts have focused on high-k dielectric materials having dielectric constants greater than that of SiO$_2$, which can be formed in a thicker layer than scaled SiO$_2$, and yet which produce equivalent field effect performance. A thicker high-k dielectric layer can thus be formed to avoid or mitigate tunneling leakage currents, while still achieving the required electrical performance equivalent (e.g., capacitance value) to a thinner SiO$_2$.

It has also been proposed to utilize hafnium-based high k dielectric materials in combination with a lanthaide series metal to lower the work function of metal gates. The lanthaide series metal is provided as a distinct surface layer over the high k dielectric material. This proposal, however, increases the overall equivalent oxide thickness (EOT) of the layer of gate oxide.

Another shortcoming of scaled CMOS devices having polysilicon gate contacts is known as polysilicon depletion. Polysilicon depletion occurs when annealing or other thermal back-end processing following the implants at 32 and 34 is insufficient to drive enough implanted impurities down the entire depth of the polysilicon gate structures. In this situation, with this limited doping concentration and under the proper biasing of the gate, a bottom portion of the polysilicon gate contact near the gate dielectric is "depleted" of charges, and acts as an insulator. The depleted portion of the gate contact and the gate dielectric operate as series connected capacitors, resulting in a reduced effective gate capacitance, which reduces the drive current capability of the device. Consequently, polysilicon depletion causes reduction in device performance which leads to poor unscalable devices. Simply increasing the implant energy and/or anneal time to combat poly depletion has adverse results, in that the corresponding depths of the concurrently implanted source/drain regions are increased.

With the relatively thick gate dielectrics and gate electrode structures of the past, poly depletion was not critical to ensuring desired device performance. However, as gate dielectrics and gate electrodes continue to become smaller through scaling, the polysilicon depletion problem is more pronounced, wherein polysilicon depletion regions of 3 to 4 angstroms become a significant fraction of the overall effective gate thickness. Thus, while polysilicon gate electrodes have previously offered flexibility in providing dual work functions at the band edges for CMOS processes, the future viability of conventional polysilicon gate technology is lessened as scaling efforts continue. Accordingly, attention has recently been directed again to the possibility of using metal gate electrodes in CMOS products. There remains a need for dual or differentiated work function capability (e.g., for PMOS and NMOS transistors) in CMOS processes. In this regard, metal work functions are not shifted as easily by the same amounts as was the case for polysilicon. Accordingly, there is a need for improved CMOS transistor gate designs and fabrication techniques by which the benefits of scaling can be achieved while avoiding or mitigating the poly depletion degradation found in conventional devices and without increasing EOT.

SUMMARY OF THE INVENTION

In one embodiment, the invention is directed to a method of fabricating PMOS and NMOS metal gate structures in a semiconductor device, the method comprising forming a high k gate dielectric in PMOS and NMOS regions above a semiconductor body; forming a screen layer above the gate dielectric in the NMOS and PMOS regions; forming a buffer layer above the screen layer in the NMOS and PMOS regions; implanting a lanthaide series metal in the NMOS region into the buffer- and screen layer and further diffuse and react with the high k gate dielectric; and patterning the screen layer and buffer layer to form an NMOS gate structure in the NMOS region and a PMOS gate structure in the PMOS region.

In another embodiment, the invention is directed to a method of fabricating PMOS and NMOS metal gate structures in a semiconductor device, the method comprising forming a high-k gate dielectric on PMOS and NMOS regions above a semiconductor body; forming a screen layer above the gate dielectric in both the NMOS region and the PMOS region, the screen layer being in one example a metal nitride; forming a buffer layer above the screen layer, the buffer layer being in one example a polysilicon; applying a first mask in the PMOS region; changing the gate electrode in the NMOS region such that a lanthanide series metal is implanted in the buffer layer, forming an alloy with the screen layer after thermal treatment appropriate with forming a device, not reacting with the gate dielectric in the NMOS region; applying a second mask over the PMOS region and depositing a first metal nitride in the NMOS region; removing the mask and depositing a second metal nitride; and patterning the metal nitride to form an NMOS gate structure in the NMOS region and a PMOS gate structure in the PMOS region.

In a further embodiment, the invention is directed to a method of fabricating PMOS and NMOS metal gate structures in a semiconductor device, the method comprising forming a high k gate dielectric on PMOS and NMOS regions above a semiconductor body; forming a screen layer above the gate dielectric in both the NMOS region and the PMOS region, the screen layer comprising a metal nitride; forming a buffer layer above the screen layer; implanting a lanthaide series metal into the metal nitride layer in the NMOS region; removing the mask and annealing to bond the lanthaide series metal into the metal nitride layer; and patterning the metal nitride to form an NMOS gate structure in the NMOS region and a PMOS gate structure in the PMOS region.

In a still further embodiment, the invention is directed to a semiconductor device comprising an NMOS transistor gate structure comprising a metal nitride structure and a high-k gate dielectric between the metal nitride structure and a semiconductor body, the gate dielectric having an implanted lanthaide series metal react with the gate dielectric; and a PMOS transistor gate structure. In yet another embodiment of the invention, the lanthaide series metal does not react with the gate dielectric, but instead reacts with the screen layer to form an alloy therewith overlying the gate dielectric.

BRIEF DESCRIPTION OF THE DRAWINGS

FIG. 1 is a simplified flow diagram illustrating a conventional polysilicon gate CMOS fabrication process including channel engineering for both PMOS and NMOS transistors;

FIG. 2 is a flow diagram illustrating an exemplary method of fabricating a metal gate electrode having a lanthaide-implanted high-k dielectric in accordance with an aspect of the present invention.

FIGS. 3A-3C are partial flow diagrams illustrating various techniques for forming tuned PMOS and NMOS metal gate structures with differentiated work functions in the fabrication method of FIG. 2;

DETAILED DESCRIPTION OF THE INVENTION

Figure 3C:
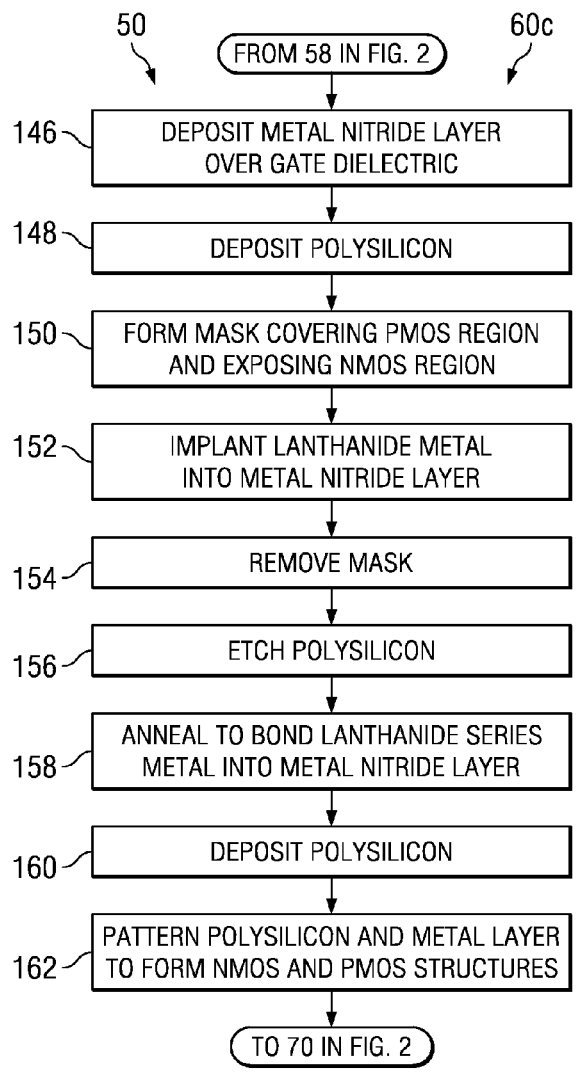

One or more implementations of the present invention will now be described with reference to the attached drawings, wherein like reference numerals are used to refer to like elements throughout, and wherein the illustrated structures are not necessarily drawn to scale. The invention relates to metal gate CMOS devices and fabrication methods. The invention may be employed to simplify channel engineering steps in particular, and fabrication processing generally, while mitigating or eliminating the capacitance depletion shortcomings of conventional CMOS devices.

In the methods and devices of the invention, metal nitride is formed above a gate dielectric in the NMOS and PMOS regions, wherein these and the gate dielectric may be formed by separate processes for the NMOS and PMOS regions. As used herein, metal nitrides are any materials comprising metal and nitrogen content, including but not limited to metal nitrides, metal silicon nitrides, metal aluminum nitrides, and metal aluminum silicon nitrides. In the examples illustrated and described herein, moreover, a single metal nitride starting material may be concurrently formed above the gate dielectric in both the NMOS region and the PMOS region, for example, using a single deposition process. The gate dielectric is then changed in the NMOS region such that a gate dielectric modified by an implant with a lanthaide series metal is provided in the NMOS region. The implanted gate dielectric may then have the desired work function or be close to the desired work function, thus allowing elimination or significant simplification of channel engineering for one or both transistor types.

Referring initially to FIGS. 2-3C, an exemplary method 50 is illustrated in FIG. 2 for fabricating metal gate structures for PMOS and NMOS transistors in accordance with the present invention. FIGS. 3A-3C illustrate various exemplary implementations of portions of the method 50 relating to creation of gate structures with differentiated work functions using a single starting material. While the exemplary method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 50 begins at 52 in FIG. 2, wherein front end processing is performed at 54. Any front end processing may be performed within the scope of the invention, wherein the processing at 54 may include, for example, formation of n and p wells using diffusion, implantation, or other suitable processing steps, as well as formation of isolation structures in field regions of a device wafer using LOCOS, STI, or any suitable isolation processing. While the figures provided show use of LOCOS type field-oxide (FOX), type isolation structures, shallow trench isolation (STI) or other type isolation structures may also be employed and are contemplated by the present invention. The methods and devices of the invention may be implemented using any type of semiconductor body, including but not limited to bulk semiconductor wafers (e.g., silicon), epitaxial layers formed over a bulk semiconductor, SOI wafers, etc. At 56 channel engineering may be performed in both the NMOS and PMOS regions, for example, threshold voltage adjustment implants, punchthrough implants, etc.

At 58, a gate dielectric is formed in the NMOS and PMOS regions using any suitable materials, material thicknesses, and processing steps, including a single thermal oxidation or deposition or combinations thereof to form a gate dielectric above the semiconductor body, which may be a single layer or multiple layers. The invention may be employed in conjunction with gate dielectric materials formed from high-k dielectrics, including but not limited to binary metal oxides including aluminum oxide ($Al_2O_3$), zirconium oxide ($ZrO_2$), hafnium oxide ($HfO_2$), lanthaide oxides (e.g., $La_2O_3$, $Yb_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthaide oxynitrides (e.g., LaON, YbON), yttrium oxynitride (YON), as well as their silicates and aluminates such as ZrSiON, HfSiON, LaSiON, YSiON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and bi-layered perovskite system material such as strontium bismuth tantalate, bismuth titanate and others. Separate processing may optionally be employed to form different gate dielectrics in the NMOS and PMOS regions within the scope of the invention. In the examples illustrated and described herein, a single thermal oxidation is performed at 58 to create a thin gate dielectric oxide overlying the substrate in the NMOS and PMOS regions.

Following gate dielectric formation at 58, the method 50 provides for gate fabrication indicated generally at 60, wherein FIG. 2 illustrates the general metal gate fabrication principles of the method 50, and FIGS. 3A-3F illustrate a few of the embodiments of the gate fabrication 60, as described further below. At 62 in FIG. 2, a screen layer of metal nitride is formed over the gate dielectric in the NMOS and PMOS regions to a thickness of, in one embodiment, from about 20 Å to about 100 Å, and in one embodiment a thickness of about 50 Å. The metal nitride may be formed at any relative component concentration (uniform or profiled), using any suitable deposition process.

Any metal nitride may be used within the scope of the invention, including but not limited to metals containing nitrogen or metal alloys containing nitrogen, of any stoichiometry or relative concentrations of metal/metal alloy and nitrogen. The materials may be formed using any metals, ternary metals, or metal alloys within the scope of the invention, for example, those that include Ti, Ta, Hf, Zr, W, Mo, or others. Thus, although illustrated and described in the examples below primarily in the context of TaN, metal nitrides including but not limited to metal nitrides $M_xN_y$, metal silicon nitrides, $M_xSi_yN_z$, metal aluminum nitrides $M_xAl_yN_z$, and metal aluminum silicon nitrides $M_WAl_xSi_yN_Z$ (where M is a metal such as Ti, Ta, Hf, Zr, W, etc.), or equivalents may be used within the scope of the invention.

Different processing steps may be used at 62 and 66 or some processing operations thereof may be concurrently performed in both the NMOS and PMOS regions within the scope of the invention. Polysilicon, tungsten, molybdenum or other suitable buffer layer is formed above the metal nitride of the NMOS and PMOS regions. As described below with respect to FIG. 3A, the gate dielectric is then modified with a lanthanide series metal in NMOS regions through implantation, after masking of the PMOS region. Any suitable implantation techniques and operational settings may be employed. The implant species comprises a lanthanide series metal and can include one or more of lanthanum, cerium, praseodymium, neodymium, promethium, samarium, europium, gadolinium, terbium, dysprosium, holmium, erbium, thulium, ytterbium, lutetium, or hafnium. While hafnium is not an actual lanthanide series element, for purposes of the present invention, hafnium is included herein. Reaction of the implanted lanthanide series metal with the gate dielectric provides adjustment of the material work function, thereby tuning the threshold voltage of the resulting PMOS or NMOS transistors without significant channel engineering, and without the process complications inherent in using two different starting metal materials.

Figure 4A:
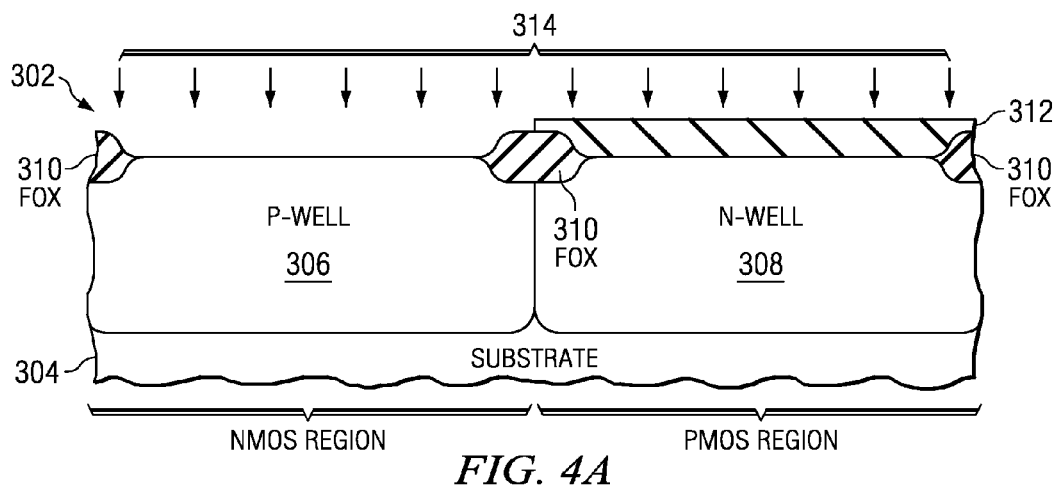
FIGS. 4A-4I are partial side elevation views in section illustrating exemplary NMOS and PMOS transistors undergoing CMOS metal gate processing in accordance with the invention at various stages of fabrication.
Figure 4B:
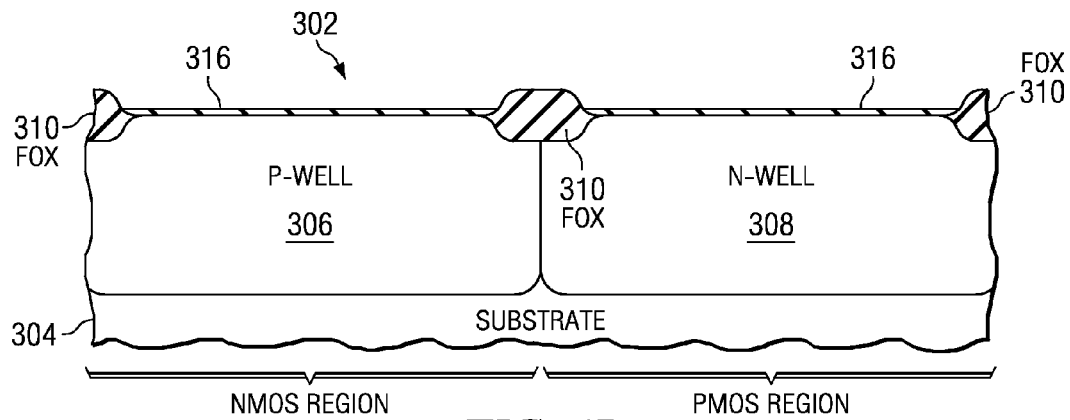
Figure 4C:
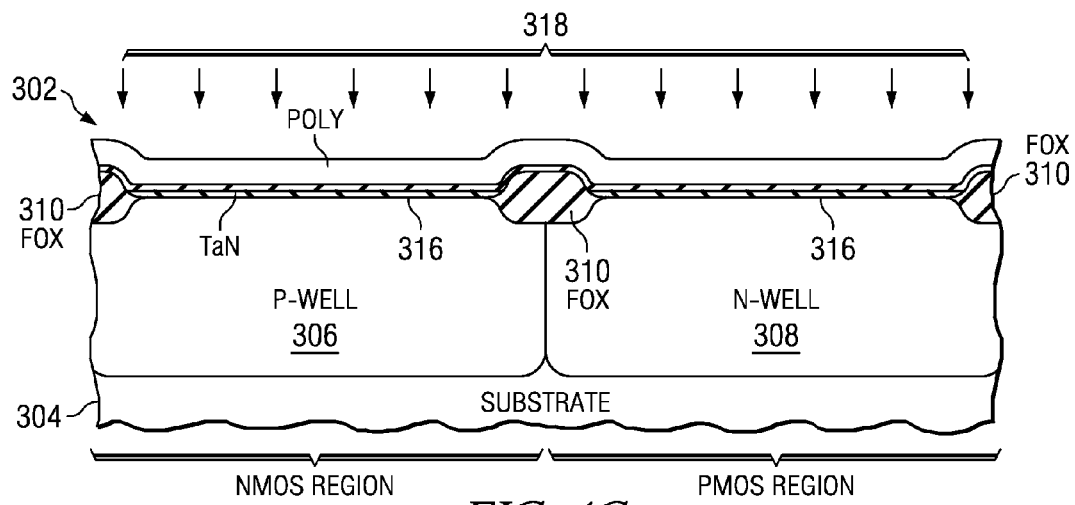
Figure 4D:
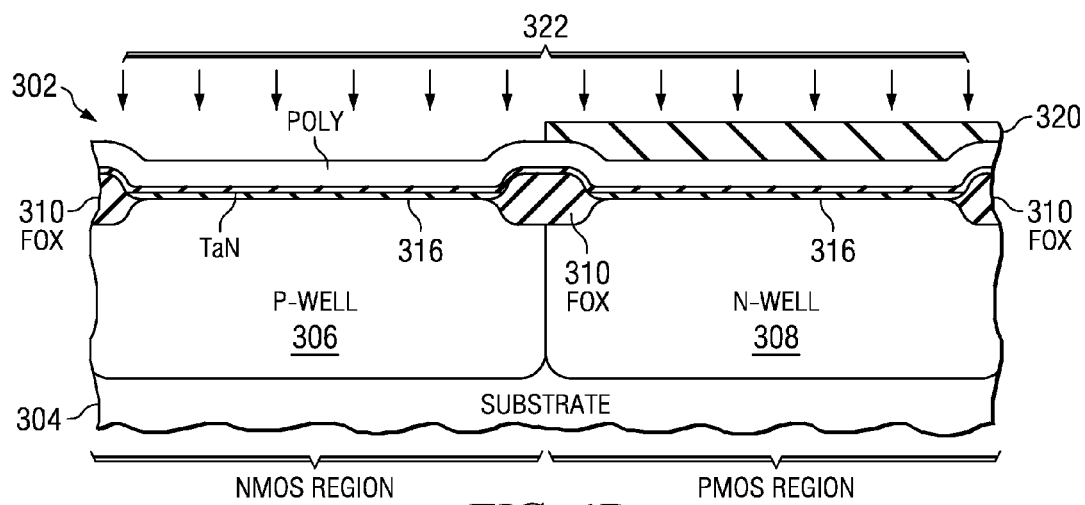

Referring now to FIGS. 2, 3A, and 4A-4I, an exemplary CMOS device 302 is illustrated in FIGS. 4A-4I at various stages of fabrication processing generally according to the method 50. In this example, the gate fabrication for the NMOS and PMOS transistors (e.g., 60 in method 50 of FIG. 2) is illustrated in further detail in FIG. 4A, where the CMOS device 302 includes a silicon substrate semiconductor body 304 with a p-well 306 formed in an NMOS region and an n-well 308 formed in a PMOS region. The device 302 further comprises shallow trench isolation (STI) or field oxide (FOX) isolation structures 310, where the wells 306, 308 and the field oxide 310 are formed during front-end processing (e.g., at 54 in FIG. 2). A mask 312 is formed that covers the PMOS region and exposes the NMOS region, and one or more NMOS channel engineering implantation processes 314 are performed (e.g., 56 in FIG. 2), which may include a Vt adjust implant to introduce boron or other p-type dopants into a prospective NMOS channel region, as well as a boron punch-thru implant, and a boron channel stop implant. As may be appreciated, similar processing steps may be employed in the PMOS region. As illustrated in FIG. 4B, a gate dielectric layer 316 is formed above the substrate 304 in both the NMOS and the PMOS regions (58 in FIG. 2). The gate dielectric layer 316 will be, in one embodiment, from about 5 to about 40 Å thick. In FIG. 4C, a screen layer of a TaN (e.g., or other metal nitride material) and a buffer layer of polysilicon are deposited over the gate dielectric 316 via a CVD, ALD, PVD, or other suitable deposition process 318 (100, 102 in FIG. 3A) in both the NMOS and PMOS regions. The thickness of the TaN layer will be, in one embodiment, from about 20-100 Å, and the thickness of the polysilicon layer will be, in one embodiment, from about 100-800 Å.

In this implementation of the invention (e.g., and others described below with respect to FIGS. 3B-3C, 5A-5H, and 6A-E), a lanthanide series metal (e.g., lanthanum, cerium, praseodymium, neodymium, promethium, samarium, europium, gadolinium, ytterbium, etc.) is implanted into the gate dielectric in the NMOS region by forming the initial TaN screen layer therein and then introducing the lanthanide series metal via the metal nitride screen layer into the gate dielectric in the NMOS region. In addition, a buffer layer may be formed over the TaN in one embodiment. In the exemplary device 302, the lanthanide series metal is implanted 322 into the screen layer above the gate dielectric to form the implanted dielectric in the NMOS region. Toward that end, a mask 320 is formed in FIG. 4D (104 in FIG. 3A) to cover the PMOS region and expose the NMOS region. An implantation process 322 is performed (106 in FIG. 3A) to provide the lanthanide metal close to the NMOS region dielectric, thus creating a lanthanide source for the NMOS gate dielectric 316, after which the mask 320 is removed (108 in FIG. 3A). The operational settings of the implantation process 322 (e.g., energy, dose, etc.) may be selected to provide the lanthanide series metal throughout all or a portion of the unmasked gate dielectric at any suitable concentrations and depth profiles thereof, wherein lanthanide series metal is preferably introduced near the interface of the gate dielectric 316 and a subsequently deposited metal 321 to form a gate structure, without doping the underlying channel region of the substrate 304.

Figure 4E:
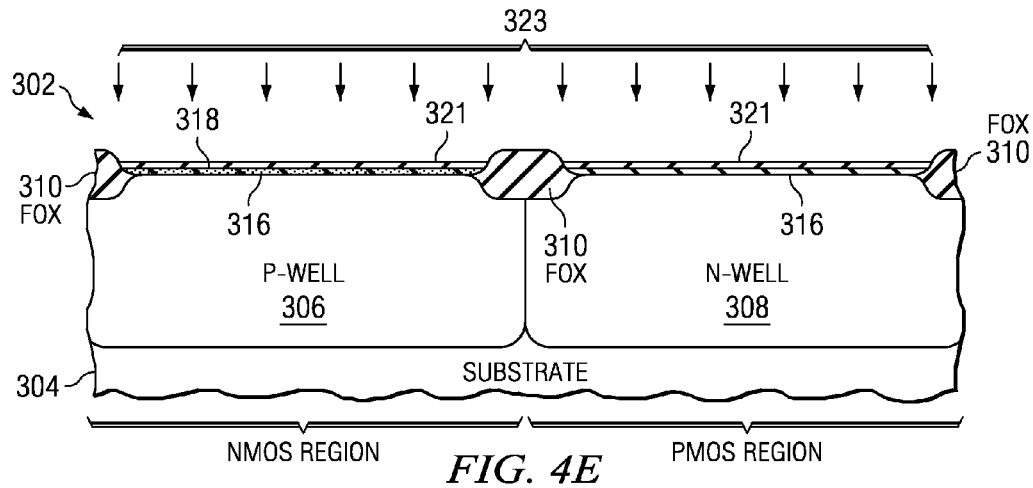
Figure 4F:
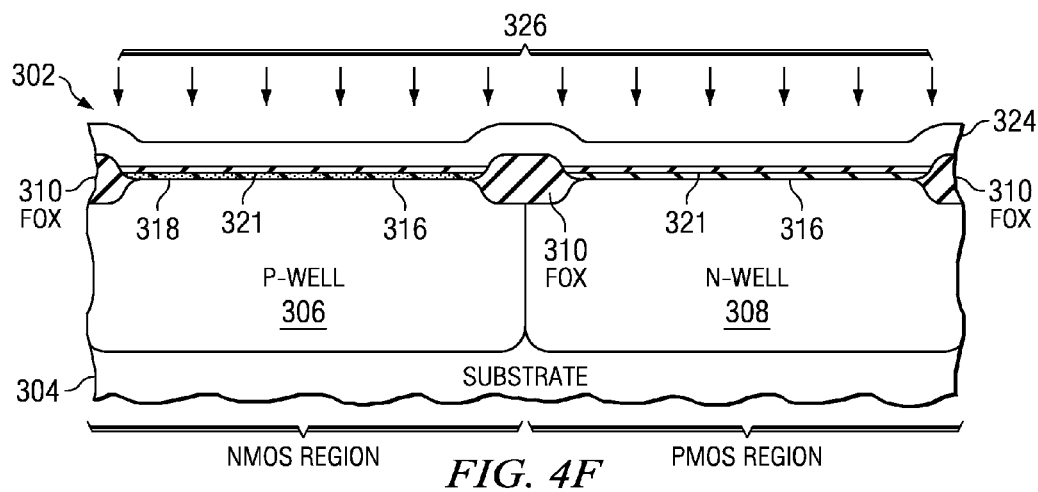
Figure 4G:
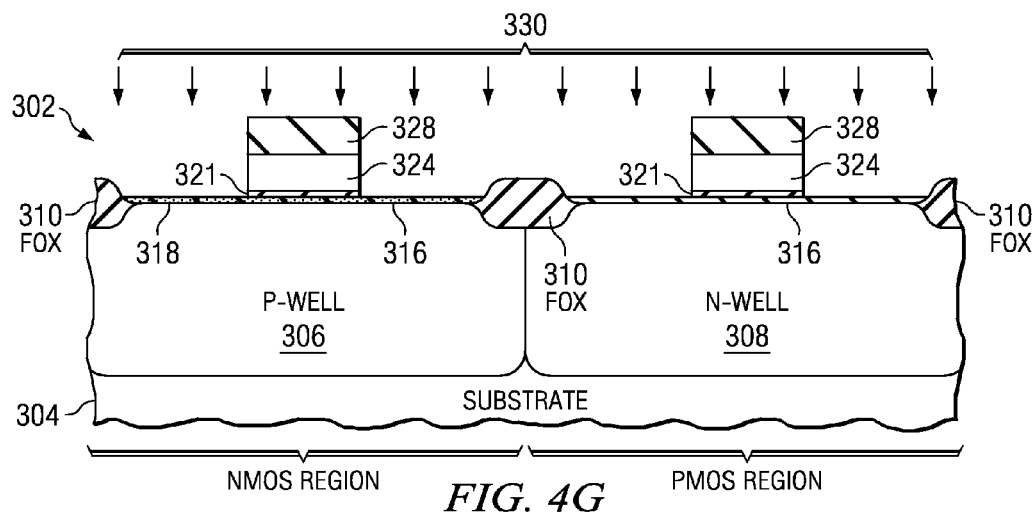
Figure 4H:
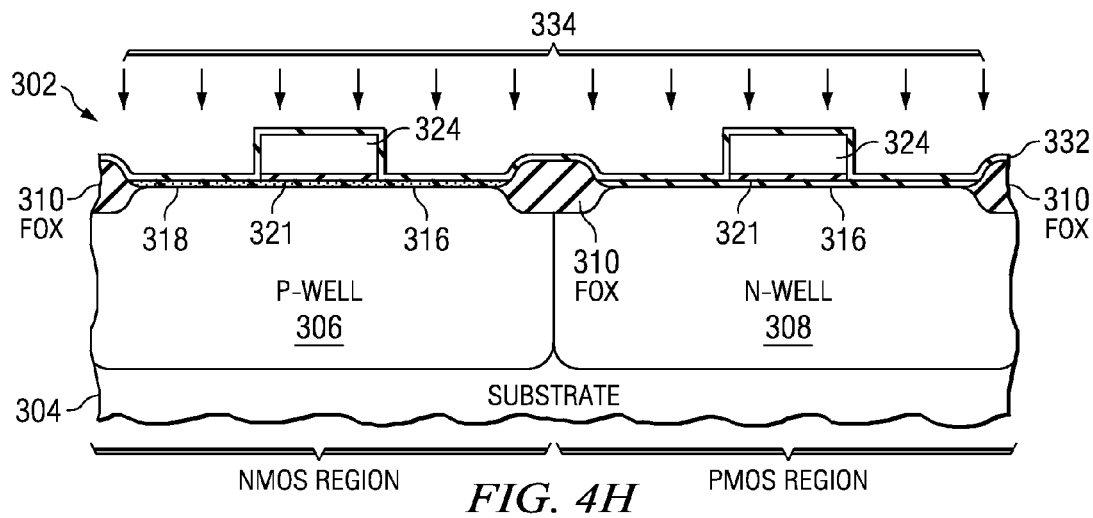

Following mask removal, an etch of the polysilicon and the TaN 110 is performed to remove the screen layers. An anneal is performed at 112 to drive or diffuse the implanted lanthanide series metal into the underlying gate dielectric 316 in the NMOS region, thereby forming a lanthaide doped gate dielectric, e.g., HfLaSiOx 318 in the NMOS region, as shown in FIG. 4E. Annealing is generally performed at a temperature of from about 500° C. to about 1000° C. in a nitrogen atmosphere for a period of time sufficient to bond the lanthaide series metal into the gate dielectric 316. A metal nitride material 321 is then deposited at 114 over the gate dielectric to a thickness of from about 20 Å to about 100 Å via a CVD, ALD, PVD, or other suitable deposition process 323 to form the metal gate. The metal nitride material 321 can be, but is not limited to, one or more of TiSiN, TaAlN, TaCN, MoN, and WN. In FIG. 4F, polysilicon 324 is deposited (116 in FIG. 3A) over the NMOS and over the PMOS regions, using any suitable deposition process 326. Other implementations of the invention are possible, which alternatively employ tungsten, molybdenum or other conductive material. In FIG. 4G, the polysilicon 324, and the metal nitride material 321 in the NMOS and the PMOS regions are patterned (118 in FIG. 3A) using a mask 328 and an etch process 330 to define patterned NMOS and PMOS gate structures. The mask 328 is then removed and the patterned gate structures are encapsulated (70 In FIG. 2) by forming a single or multi-layer encapsulation structure 332 along the sidewalls and top of the gate structures, as illustrated in FIG. 4G. HDD implants 334 are performed (72 in FIG. 2) in FIG. 4H to introduce p-type dopants into prospective PMOS source/drains 336 and to introduce n-type dopants into prospective NMOS source/drains 338, wherein the field oxide 310 and patterned gate structures operate as an implantation mask.

Figure 4I:
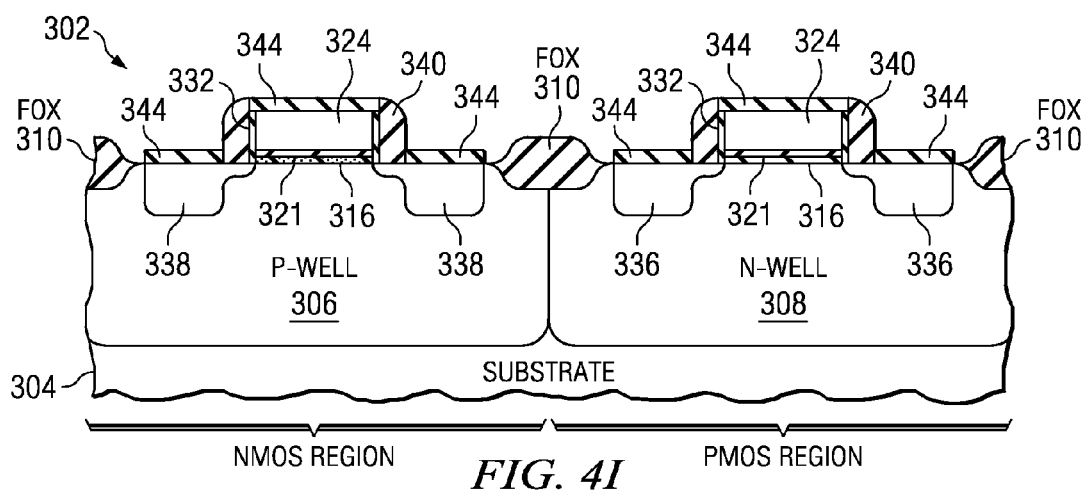

In FIG. 4I, $SiO_2$ or $Si_3N_4$ sidewall spacers 340 are formed along the lateral sidewalls of the patterned gate structures (74 in FIG. 2), and source/drain implants are performed using suitable masks (not shown) to further define the source/drains 336 and 338 and to provide p-type and n-type dopants to the PMOS and NMOS gate polysilicon 324. Thereafter, self-aligned silicide contacts 344 (salicide) are formed (80 in FIG. 2) over the source/drains 336, 338, and the doped gate polysilicon 324, after which metallization and other back-end processing (82 in FIG. 2) may be performed (not shown in FIG. 4I).

Figure 5A:
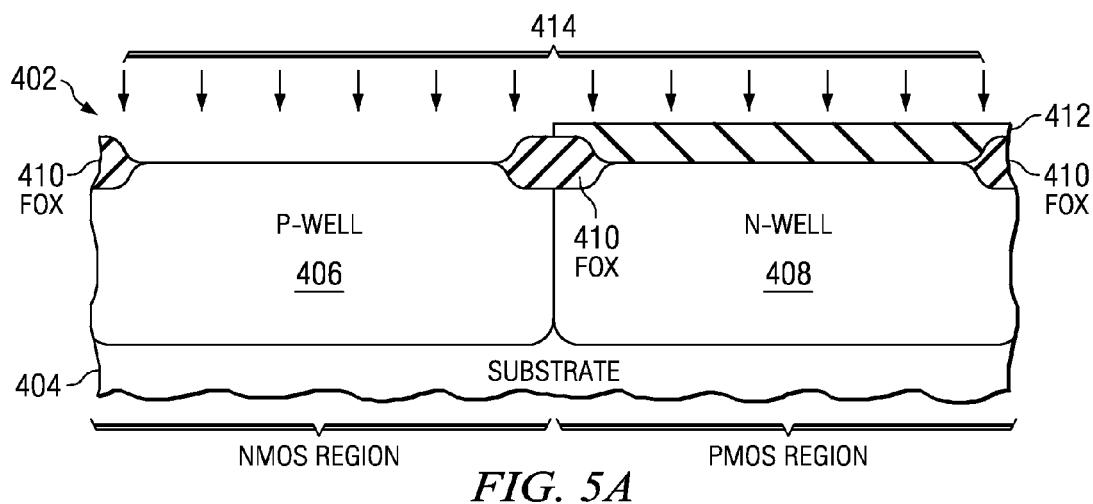
FIGS. 5A-5H are partial side elevation views in section illustrating exemplary NMOS and PMOS transistors undergoing CMOS metal gate processing in accordance with another implementation of the invention.
Figure 5B:
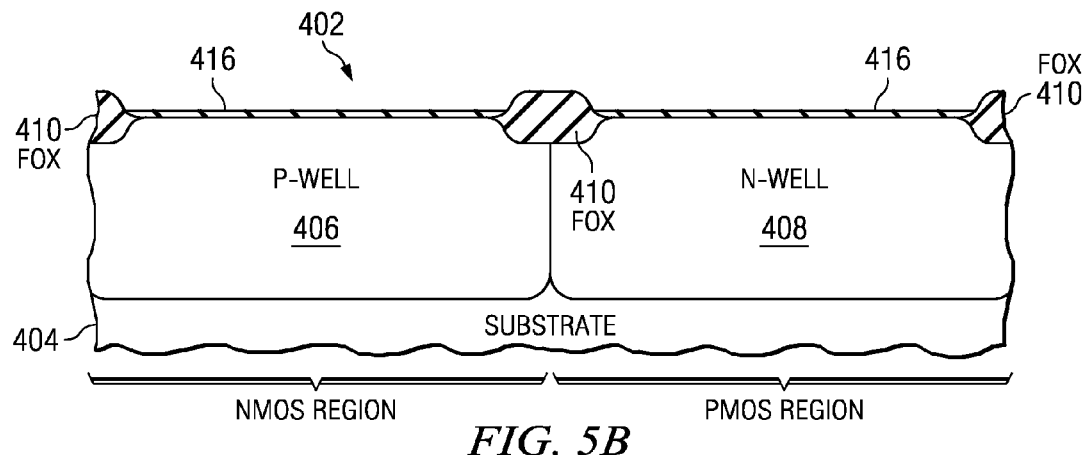
Figure 5C:
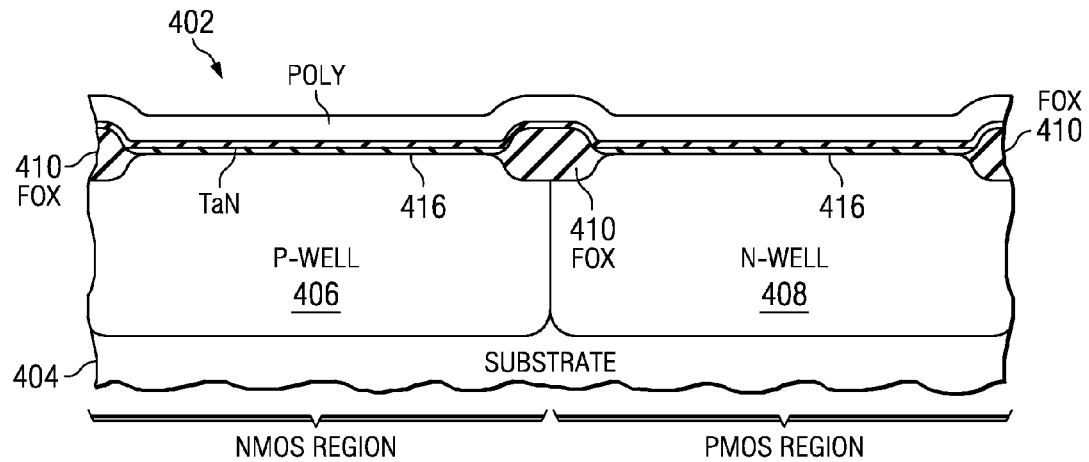
Figure 5D:
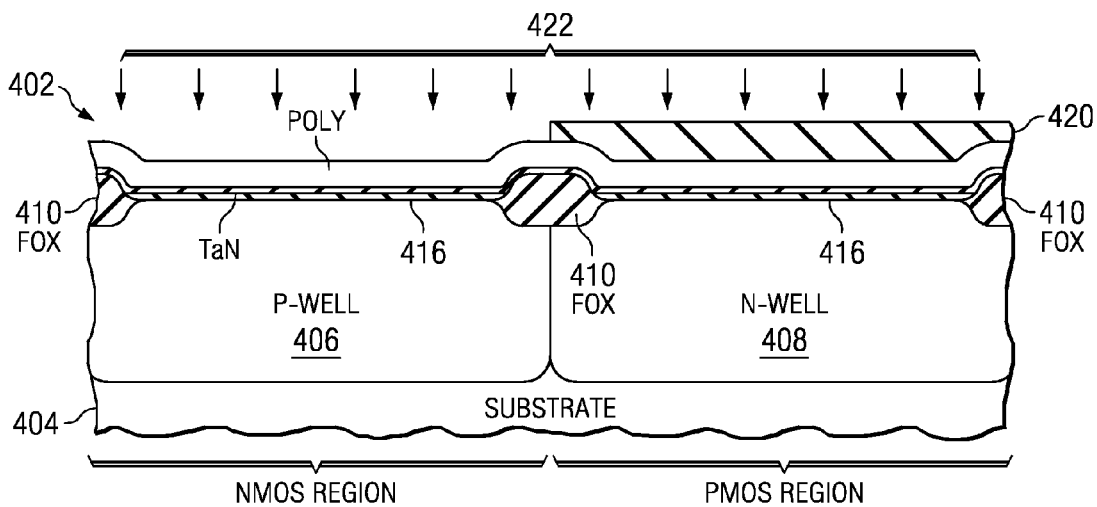
Figure 5E:
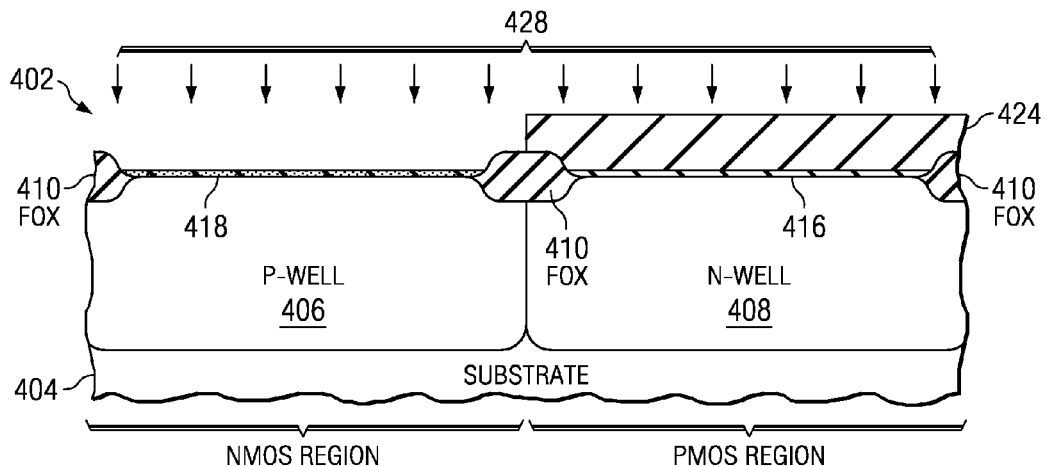

Referring now to FIGS. 2, 3B and 5A-5G, another variant implementation 60b of the gate fabrication processing 60 in the method 50 of FIG. 2 is illustrated. As illustrated in FIG. 5A, the MOS device 402 includes a silicon substrate semiconductor body 404 with a p-well 406 formed in an NMOS region and an n-well 408 formed n a PMOS region. The device 402 further comprises field oxide (FOX) isolation structures 410, where the wells 406, 408 and the field oxide 410 are formed during front-end processing (e.g., at 54 in FIG. 2). A mask 412 is formed that covers the PMOS region and exposes the NMOS region, and one or more NMOS channel engineering implantation processes 414 are performed (e.g., 56 in FIG. 2). Similarly, such engineering may be performed in the PMOS region, in one embodiment. A gate dielectric layer 416 is formed above the substrate 404 in both the NMOS and the PMOS regions (58 in FIG. 2). A screen layer of metal nitride (TaN in FIG. 5C) is formed over the gate dielectric 416 in both the NMOS and PMOS regions at 120. Polysilicon is deposited 122 over the TaN in both the NMOS and PMOS regions. The PMOS region is masked 420 at 124, and a lanthanide metal series implant 422 is performed at 126 through the NMOS polysilicon and into the TaN layers of the NMOS region. The implant mask 420 is removed at 128 and an etch of the polysilicon and TaN is performed at 130. An annealing step 132 is then performed 428 to drive or diffuse the implanted lanthanide series metal into the underlying gate dielectric 416 in the NMOS region, thereby forming HfLaSiOx 418 in the NMOS region as shown in FIG. 5E. A second mask is 424 applied over the PMOS region at 134.

Figure 5F:
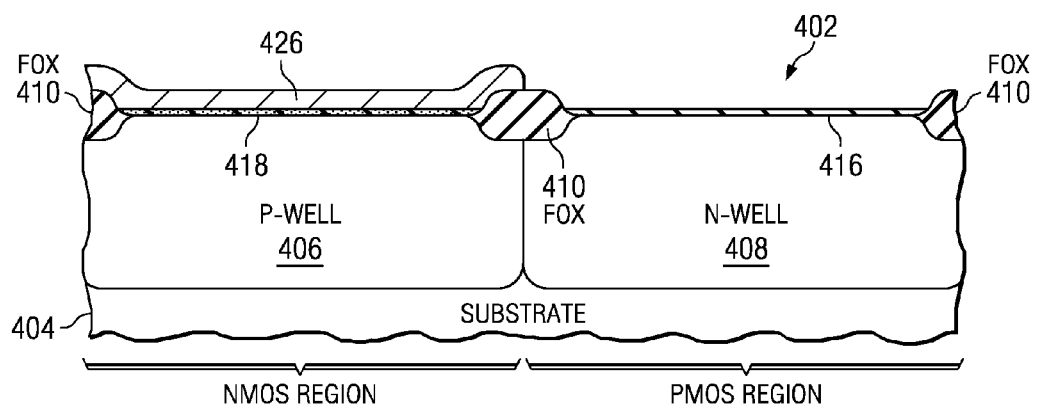
Figure 5G:
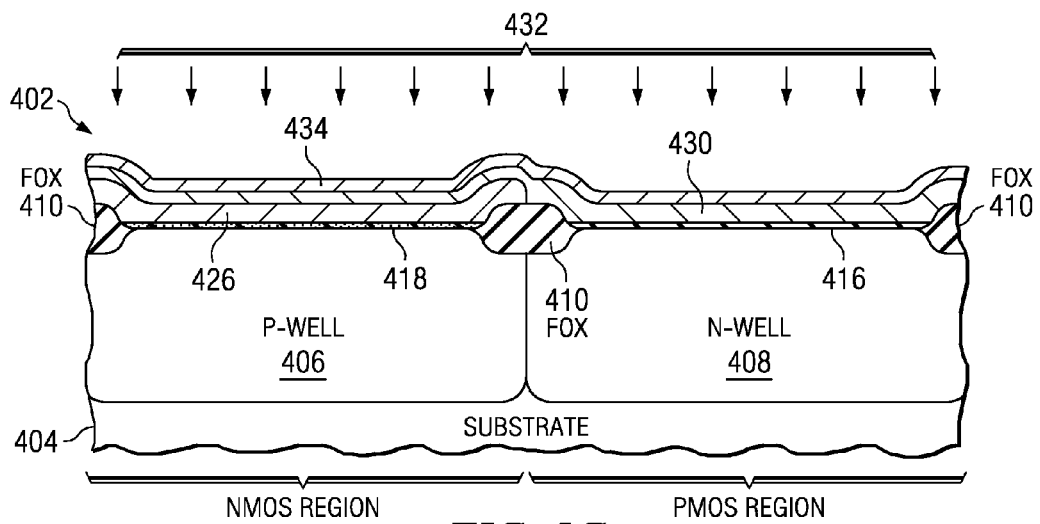
Figure 5H:
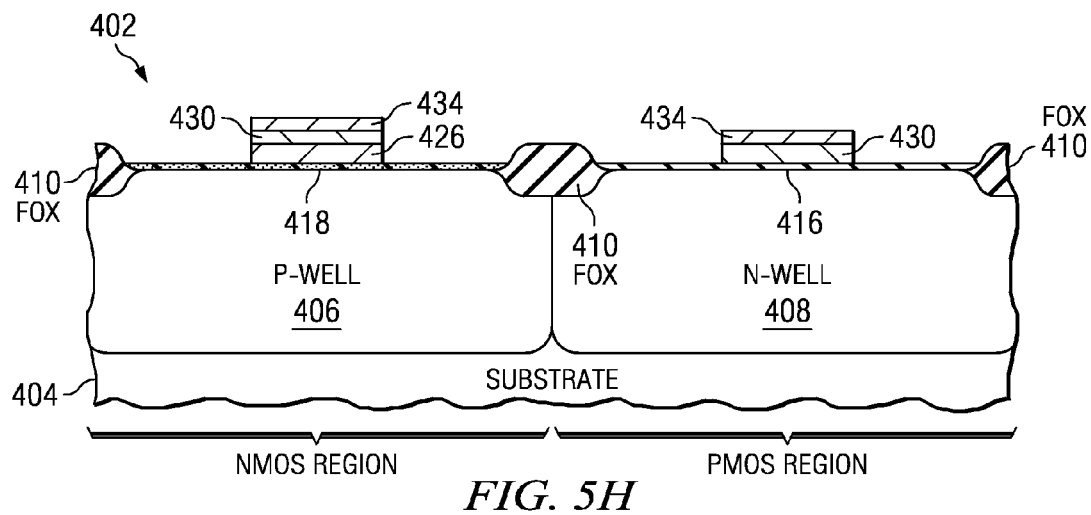

As shown in FIG. 5F, a first metal nitride material 426 is deposited at 136 over the NMOS region via a CVD, ALD, PVD, or other suitable deposition process. For example, the material 426 is deposited over both NMOS and PMOS regions and then removed from the PMOS region, as illustrated in FIG. 5F. Following mask 424 removal at 138, in FIG. 5G a second metal nitride is 430 deposited over the NMOS and PMOS regions at 140. Polysilicon 434 is deposited (142 in FIG. 3B) over the NMOS and over the PMOS regions, using any suitable deposition process 432, as illustrated in FIG. 5G. The polysilicon 434, the second metal nitride material 430 and the first metal nitride material 426 in the NMOS and the PMOS regions are patterned (144 in FIG. 3B) using a mask and an etch process to define patterned NMOS and PMOS gate structures, as illustrated in FIG. 5H. The structure 402 can then proceed through further processing steps as described with reference to FIGS. 4H and 4I.

Figure 6A:
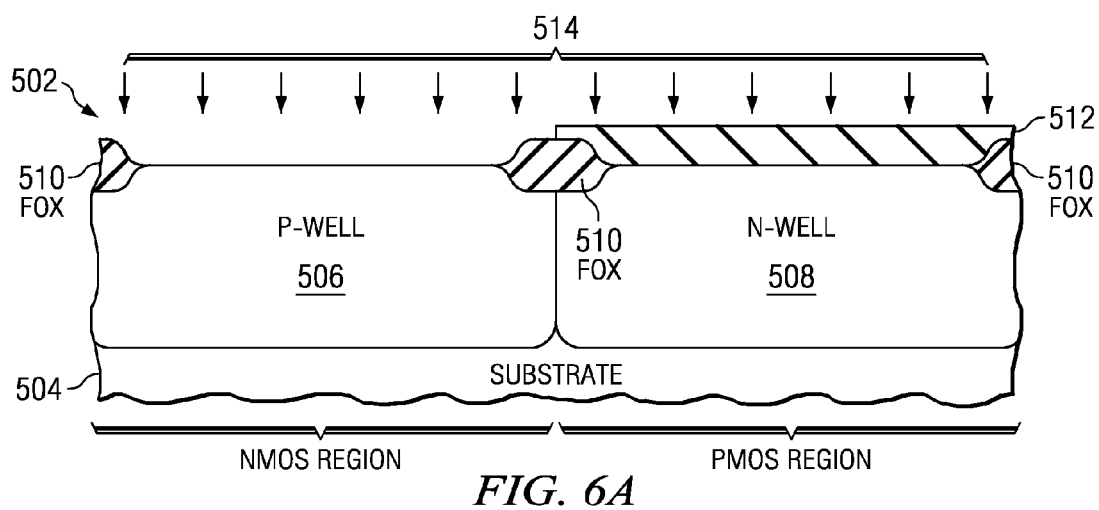
FIGS. 6A-6E are partial side elevation views in section illustrating exemplary NMOS and PMOS transistors undergoing CMOS metal gate processing in accordance with yet another implementation of the invention.
Figure 6B:
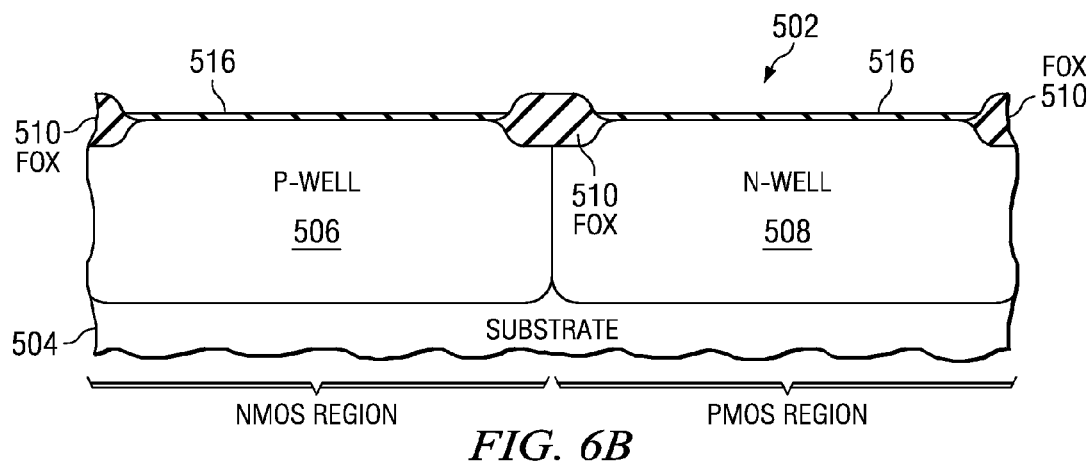
Figure 6C:
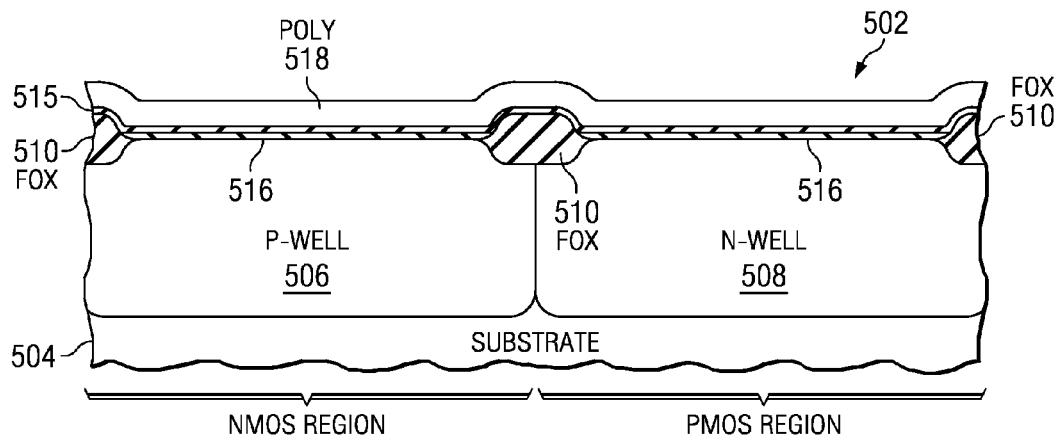
Figure 6D:
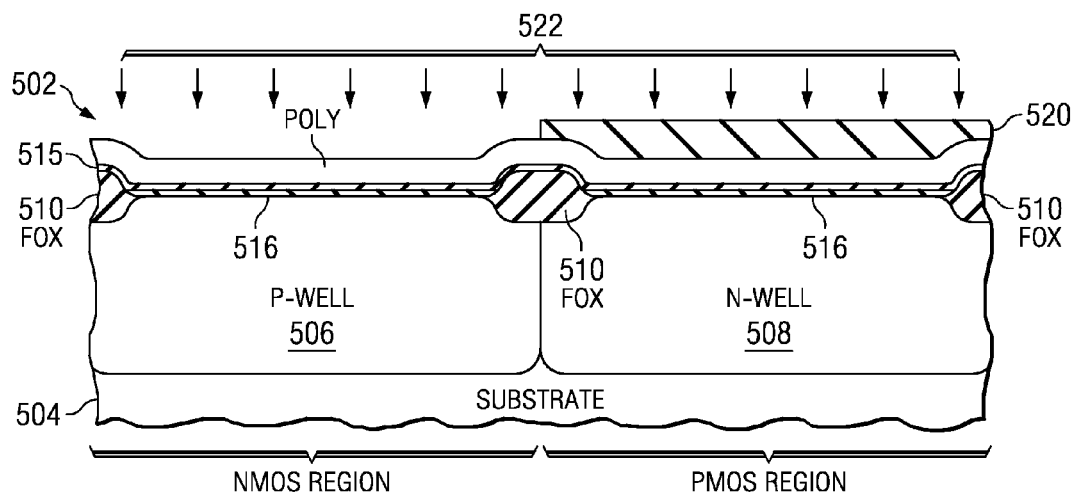

In another possible implementation, as shown in FIGS. 2, 3C, and 6A-E, there is illustrated another variant of the gate fabrication processing 60 in the method 50 of FIG. 2. The particular embodiment will be utilized with metals having a higher work function, e.g., tungsten nitride. Processing proceeds through similar steps as in the embodiments shown in FIGS. 4 and 5. The MOS device 502 includes a silicon substrate semiconductor body as shown in FIG. 6A. A p-well 506 is formed in an NMOS region and an n-well 508 is formed in a PMOS region. The device 502 further comprises field oxide (FOX) isolation structures 510, where the wells 506, 508 and the field oxide 510 are formed during front-end processing (e.g., at 54 in FIG. 2). A mask 512 is formed that covers the PMOS region and exposes the NMOS region, and one or more NMOS channel engineering implantation processes 514 are performed (e.g., 56 in FIG. 2). Similarly, such channel engineering may be performed in the PMOS region, in one embodiment. A gate dielectric layer 516 is formed above the substrate 504 in both the NMOS and the PMOS regions (58 in FIG. 2). A screen layer of metal nitride 515 (FIG. 6C) is formed over the gate dielectric 516 in both the NMOS and PMOS regions at 146. Polysilicon 518 is deposited 148 over the metal nitride in both the NMOS and PMOS regions. The PMOS region is masked 520 at 150, and a lanthanide metal series implant 522 is performed at 152 directly into the metal nitride layer in the NMOS region as illustrated in FIG. 6D. Implantation 522 into the metal itself is accomplished by varying the thickness of the polysilicon buffer layer and the metal nitride layer, e.g., on the order of from 50-200 Å. Implantation of the lanthanide series metal in this manner eliminates the necessity for a subsequent second metal layer.

Figure 6E:
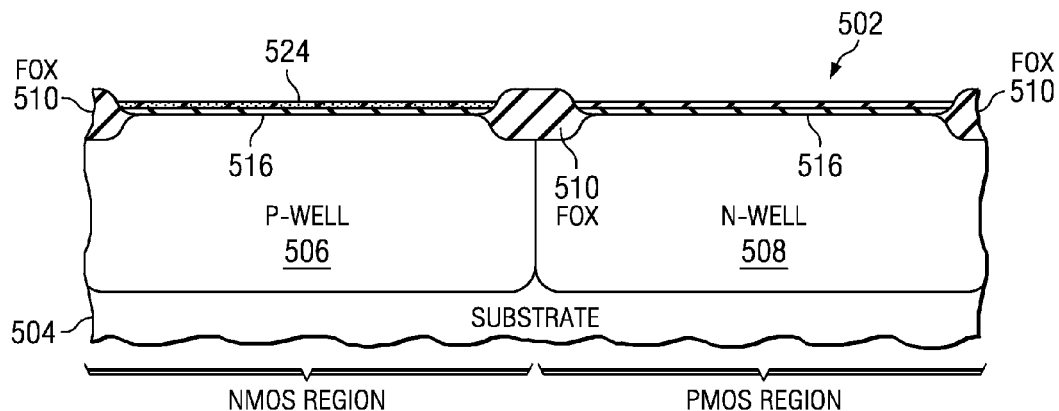

Following mask 520 removal at 154, an etch of the polysilicon 518 is performed and an anneal performed to bond the lanthanide series metal into the metal nitride layer 524 (FIG. 6E). Polysilicon is then deposited at 160 over the NMOS and over the PMOS regions, using any suitable deposition process. The polysilicon and the metal nitride layer 524 in the NMOS and the PMOS regions are then patterned (158 in FIG. 3C) using a mask and an etch process to define patterned NMOS and PMOS gate structures. Further back end processing may then be performed (not shown). The process may then proceed as discussed supra.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device including PMOS and NMOS metal gate structures having different work functions, the method comprising:
   forming a gate dielectric layer over an NMOS transistor region of a semiconductor substrate;
   forming a metal nitride screen layer over the gate dielectric layer;
   forming a polysilicon buffer layer over the metal nitride screen layer;
   implanting a lanthanide series metal or hafnium through the polysilicon buffer layer into the metal nitride screen layer; and
   forming a gate structure in the NMOS region.

2. The method of claim 1, wherein the metal nitride screen layer comprises one or more of metal nitrides $M_xN_y$, metal silicon nitrides, $M_xSi_yN_z$, metal aluminum nitrides $M_xAl_yN_z$, or metal aluminum silicon nitrides $M_wAl_xSi_yN_z$, where M is one of Ti, Ta, Hf, Zr, Mo and W.

3. The method of claim 2, wherein the metal nitride screen layer comprises TaN.

4. The method of claim 1, wherein the lanthanide series metal comprises one or more of lanthanum, cerium, praseodymium, neodymium, promethium, samarium, europium, gadolinium, terbium, dysprosium, holmium, erbium, thulium, ytterbium, lutetium.

5. The method of claim 1, wherein the lanthanide series metal or hafnium is implanted near a top portion of the gate dielectric layer; and the method further comprises annealing to drive or diffuse the implanted lanthanide series metal or hafnium into the gate dielectric layer.

6. A method of fabricating a semiconductor device including PMOS and NMOS metal gate structures, the method comprising:
    forming a gate dielectric over PMOS and NMOS regions of a semiconductor substrate;
    forming a metal nitride screen layer over the gate dielectric over the NMOS and PMOS regions;
    forming a polysilicon buffer layer over the metal nitride screen layer over the NMOS and PMOS regions;
    forming a first mask over the polysilicon buffer layer to cover the PMOS region and to leave the NMOS region exposed;
    implanting a lanthanide series metal or hafnium into the polysilicon buffer layer to place the implanted material near the gate dielectric in the NMOS region;
    annealing to react the implanted lanthanide series metal or hafnium with the gate dielectric in the NMOS region; and
    forming an NMOS gate structure in the NMOS region and a PMOS gate structure in the PMOS region.

7. The method of claim 6, wherein the metal nitride screen layer comprises one or more of metal nitrides $M_xN_y$, metal silicon nitrides, $M_xSi_yN_z$, metal aluminum nitrides $M_xAl_yN_z$, or metal aluminum silicon nitrides $M_wAl_xSi_yN_z$, where M is one of Ti, Ta, Hf, Zr, Mo and W.

8. The method of claim 7, wherein the metal nitride screen layer comprises TaN.

9. The method of claim 8, wherein the lanthanide series metal comprises one or more of lanthanum, cerium, praseodymium, neodymium, promethium, samarium, europium, gadolinium, terbium, dysprosium, holmium, erbium, thulium, ytterbium, lutetium.

10. The method of claim 6, further comprising removing the metal nitride screen layer and polysilicon buffer layer after the annealing; and thereafter forming a second metal nitride layer over the gate dielectric; wherein the second metal nitride comprises one or more of metal nitrides $M_xN_y$, metal silicon nitrides, $M_xSi_yN_z$, metal aluminum nitrides $M_xAl_yN_z$, or metal aluminum silicon nitrides $M_wAl_xSi_yN_z$, where M is one of Ti, Ta, Hf, Zr, Mo and W.

11. A method of fabricating a semiconductor device having PMOS and NMOS metal gate structures, the method comprising:
    forming a high k gate dielectric over PMOS and NMOS regions of a semiconductor substrate;
    forming a metal nitride layer over the high k gate dielectric over both the NMOS and PMOS regions;
    forming a polysilicon buffer layer over the metal nitride layer;
    applying a mask over the polysilicon buffer layer to cover the PMOS region and to leave the NMOS region exposed;
    with the mask covering the PMOS region, implanting a lanthanide series metal or hafnium into the metal nitride layer over the NMOS region;
    removing the mask;
    annealing to bond the lanthanide series metal into the metal nitride layer; and
    patterning the metal nitride layer to form an NMOS gate structure in the NMOS region and a PMOS gate structure in the PMOS region.

12. The method of claim 11, wherein the lanthanide series metal comprises one or more of lanthanum, cerium, praseodymium, neodymium, promethium, samarium, europium, gadolinium, terbium, dysprosium, holmium, erbium, thulium, ytterbium, lutetium.

* * * * *